(12) United States Patent  
Fohrenkamm et al.

(10) Patent No.: US 9,096,051 B1  
(45) Date of Patent: Aug. 4, 2015

(54) FORMING PRINTED PATTERNS OF MULTIPLE PRINT MATERIALS

(71) Applicants: Elsie Anderson Fohrenkamm, St. Paul, MN (US); Gregory Lloyd Zwadlo, River Falls, WI (US); Charles W. Simpson, Lakeland, MN (US)

(72) Inventors: Elsie Anderson Fohrenkamm, St. Paul, MN (US); Gregory Lloyd Zwadlo, River Falls, WI (US); Charles W. Simpson, Lakeland, MN (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/161,736

(22) Filed: Jan. 23, 2014

(51) Int. Cl.
| | |
|---|---|
| *B41F 5/24* | (2006.01) |
| *B41F 17/00* | (2006.01) |
| *B82Y 10/00* | (2011.01) |
| *B82Y 40/00* | (2011.01) |
| *H05K 3/12* | (2006.01) |
| *H01B 13/00* | (2006.01) |

(52) U.S. Cl.  
CPC . *B41F 5/24* (2013.01); *B41F 17/00* (2013.01); *B82Y 10/00* (2013.01); *B82Y 40/00* (2013.01); *H01B 13/0026* (2013.01); *H05K 3/1275* (2013.01); *H05K 2203/0143* (2013.01)

(58) Field of Classification Search  
CPC ........... B41F 5/24; B41F 17/00; G03G 7/002; H05K 3/1275; H05K 2203/0143; H01B 3/0026

See application file for complete search history.

(56) References Cited

U.S. PATENT DOCUMENTS

| | | | |
|---|---|---|---|
| 5,752,442 A * | 5/1998 | Johnson et al. | 101/211 |
| 6,772,683 B2 | 8/2004 | Laksin et al. | |
| 7,026,012 B2 | 4/2006 | Chen et al. | |
| 2004/0003734 A1 | 1/2004 | Shively et al. | |
| 2007/0289459 A1 | 12/2007 | Laksin et al. | |
| 2008/0233280 A1 | 9/2008 | Blanchet et al. | |
| 2008/0233489 A1 * | 9/2008 | Blanchet et al. | 430/5 |
| 2010/0215865 A1 | 8/2010 | Keoshkerian et al. | |
| 2013/0319271 A1 * | 12/2013 | Sakamoto | 101/217 |

* cited by examiner

*Primary Examiner* — Blake A Tankersley  
(74) *Attorney, Agent, or Firm* — J. Lanny Tucker

(57) ABSTRACT

A multilayer structure having at least two different print materials pattern is formed on a receiver element using an elastomeric relief element having a relief pattern. Multiple different printable material compositions are sequentially applied only to the uppermost relief surface of the elastomeric relief element and at least at least 50 weight % of a carrier liquid is removed from each printable material composition. During contact of the multilayer structure on the uppermost relief surface and the receiver element, the elastomeric relief element is compressed by at least 10 μm of its original thickness. The elastomeric relief element is then separated from the receiver element to leave a pattern of the multilayer structure on the receiver element, wherein at least 70 weight % of the multiple print materials is transferred to the receiver element.

20 Claims, 1 Drawing Sheet

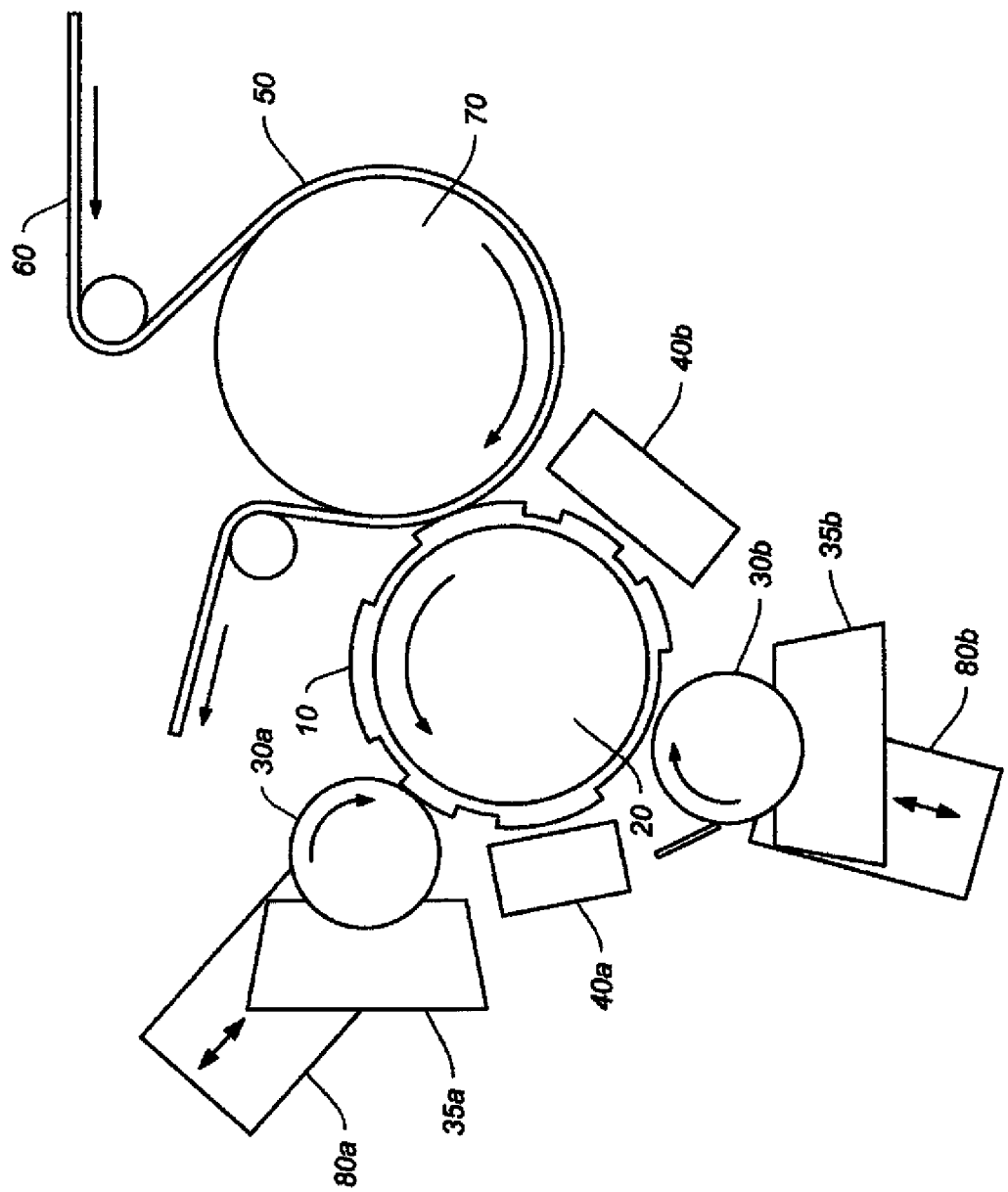

FORMING PRINTED PATTERNS OF MULTIPLE PRINT MATERIALS

RELATED APPLICATIONS

Reference is made to the following copending and commonly assigned patent applications, the disclosures of which are incorporated herein by reference:

U.S. Ser. No. 14/150,118 filed Jan. 8, 2014 by Zwadlo, Fohrenkamm, and Simpson as a Continuation-in-part application of U.S. Ser. No. 13/759,092, filed Feb. 2, 2013, now abandoned; and U.S. Ser. No. 14/134,085 filed on Dec. 19, 2013 by Fohrenkamm, Simpson, and Zwadlo.

FIELD OF THE INVENTION

This invention relates to a method for forming or printing a print material in a printable material composition onto a suitable receiver element to provide a printed pattern. This printing method is carried out using an elastomeric relief element to apply (for example, laminate print) at least two different print materials in different printable material compositions to a receiver element after at least some of the volatile carrier liquid is removed from the multiple printable material compositions.

BACKGROUND OF THE INVENTION

Relief images can be provided and used in various articles for many different purposes. For example, the electronics, display, and energy industries rely on the formation of coatings and patterns of conductive materials to form circuits on organic and inorganic substrates. Such coatings and patterns are often provided using relief imaging methods and relief image forming elements. There is also need for means to provide fine wiring in various articles.

Microelectronic devices have been prepared by photolithographic processes to form necessary patterns. Photolithography, however, is a complex, multi-step process that is too costly for the printing of electronic devices on plastic substances.

Contact printing is a flexible, non-lithographic method for forming patterned materials. Contact printing potentially provides a significant advance over conventional photolithographic techniques since contact printing can form relatively high resolution patterns for electronic parts assembly. Microcontact printing can be characterized as a high resolution technique that enables patterns of micrometer dimensions to be imparted onto a substrate surface. Contact printing is a possible replacement to photolithography in the fabrication of microelectronic devices, such as radio frequency tags (RFID), sensors, and memory and back panel displays. The capability of microcontact printing to transfer a self-assembled monolayer (SAM) forming molecular species to a substrate has also found application in patterned electroless deposition of metals. SAM printing is capable of creating high resolution patterns, but is generally limited to forming metal patterns of gold or silver for example using thiol chemistry. Although there are variations, in SAM printing a positive relief pattern provided on an element having a relief image is inked onto a substrate.

Flexography is a one method of printing or pattern formation that is commonly used for high-volume printing runs. It is usually employed for printing on a variety of soft or easily deformed materials including but not limited to, paper, paperboard stock, corrugated board, polymeric films, fabrics, metal foils, glass, glass-coated materials, flexible glass materials, and laminates of multiple materials. Coarse surfaces and stretchable polymeric films are economically printed using flexography.

Flexographic printing members are sometimes known as "relief" printing members (for example, relief-containing printing plates, printing sleeves, or printing cylinders) and are provided with raised relief images onto which ink is applied for application to a printable material. While the raised relief images are inked, the relief "floor" should remain free of ink. These flexographic printing precursors are generally supplied with one or more imageable layers that can be disposed over a backing layer or substrate. Flexographic printing also can be carried out using a flexographic printing cylinder or seamless sleeve having the desired relief image.

A method for printing with a conductive ink using a relief printing plate at high print speed is described in U.S. Patent Application Publication 2004/0003734 (Shively et al.).

U.S. Pat. No. 7,026,012 (Chen et al.) describes a method for transferring catalytic particles from a stamp to a substrate followed by plating the catalytic particles.

U.S. Patent Application Publication 2008/0233280 (Blanchet et al.) describes the use of an elastomeric stamp having a relief structure with a raised surface that is treated with heat or by other means to enhance its wettability, and then application and transfer of a functional material to form a pattern on a substrate.

While there are numerous methods described in the art to form patterns using relief images, there remains a need to find a way to consistently provide patterns with high resolution lines (for example, 10 μm or less) and feature uniformity using various printable material compositions (or what are sometimes known as "inks"). The industry has been pursuing these goals for many years with limited success and continued research is being done to achieve these goals using a wide variety of print materials. A number of problems must been addressed to achieve the desired high resolution lines.

U.S. Pat. No. 6,772,683 (Laksin et al.) describes a method for applying sequential the same flexographic printing ink by controlling the time between ink layer applications such that sufficient diluents evaporates from each applied layer to increase the viscosity of the first applied layer. A similar method is also described in U.S. Patent Application Publication 2007/0289459 (Laksin et al.) in which sequentially applied ink layers are partially cured.

U.S. Pat. No. 7,026,012 (Chen et al.) describes multiple depositing the same composition of catalytic particles on a selected area of a stamp for eventual application to a substrate.

Transfer of silver-containing conductive "inks" using the noted flexographic printing processes relies upon a good release of the conductive ink from the elastomeric relief element in contact with a receiver element, good affinity of the conductive ink for the receiver element, and the compositional cohesiveness of the conductive ink. There are continued efforts to solve these problems and especially to improve the internal cohesiveness as well as the conductivity of the conductive materials in the transferred ink.

There are numerous structures that can, in theory, be printed. One difficulty with printing multilayer structures, especially to achieve fine features (such as fine lines), is accurate alignment of repeated printing steps. When printing metallic lines, there is also a problem that many conductive inks are highly reflective, and this reflectivity can be a concern in multilayer structures for certain uses, such as transparent conductive elements.

The present invention is one effort to address one or more of these problems and to provide an improved method for printing a conductive relief image particularly using electrically conductive compositions.

SUMMARY OF THE INVENTION

The present invention provides a method for forming a pattern of a print material on a receiver element comprising a print material receptive layer, the method comprising:

providing an elastomeric relief element that comprises a relief pattern comprising (1) an uppermost relief surface, and (2) an average relief image depth of at least 50 μm relative to the uppermost relief surface, applying a first printable material composition to the uppermost relief surface of the elastomeric relief element, the first printable material composition comprising a first print material and a carrier liquid, removing at least 50 weight % of the carrier liquid from the first printable material composition that is disposed on the uppermost relief surface of the elastomeric relief element, leaving the first print material on the uppermost relief surface, applying a second printable material composition to the first print material on the uppermost relief surface of uppermost relief surface, the second printable material comprising a second print material and a carrier liquid, removing at least 50 weight % of the carrier liquid from the second printable material composition, forming a multilayer structure comprised of the second print material disposed on the first print material, on the uppermost relief surface, and transferring the multilayer structure from the uppermost relief surface to a receptive surface of a receiver element, wherein the first print material and the second print material are different at least compositionally.

This invention further provides a printing member comprising:

(a) an elastomeric relief element that comprises a relief pattern comprising (1) an uppermost relief surface, and (2) an average relief image depth of at least 50 μm relative to the uppermost relief surface, and (b) a multilayer structure disposed on the uppermost relief surface, the multilayer structure comprising, in order from the uppermost relief surface: (i) a first printable material composition comprising a first print material, and (ii) a second printable material composition comprising a second print material, wherein the first print material and the second print material are different at least compositionally.

In addition, the method of this invention can be used to provide a printed receiver element comprising:

a receptive surface having disposed thereon a printed pattern comprising a printed multilayer structure that comprises, in order from the receptive surface, (1) a second print material, and (2) a first print material. It is particularly useful when one or both of the first print material and the second print material are electrically conductive print materials.

In addition, the present invention provides a product from the method of this invention, for example, a printed electrically conductive pattern on a receiver element, which printed electrically conductive pattern has been electrolessly plated. The resulting electrically conductive article can be incorporated into any suitable device such as a touch screen panel or touch screen device useful in a variety of devices.

The method of this invention provides a number of advantages for what can be known as "functional printing". For example, the method provides a means for obtaining high resolution printed patterns of multilayer structures on various substrates (or receiver elements) using print materials as described below. The high resolution line features in printed patterns are obtained by a unique series of operations including removal of at least some of the liquid used to uniformly disperse and "carry" the print material in each printable material composition on an elastomeric relief element that is used as the printing element.

In addition, multiple applications of printable material composition are made to the elastomeric relief element to form a multilayer structure, but each printable material composition is different compositionally from the others. The printable material compositions that are "stacked" on each other as a multilayer structure can be made more viscous by removal of some of the carrier liquid, are then transferred to a receiver element, for example before the elastomeric relief element is separated from the receiver element. The elastomeric relief element used for this transfer can be provided in a variety of ways (described below) including but not limited to, the use of flexographic printing elements.

The multiple applications of the printable material composition, with carrier liquid removal between applications, can increase conductivity or other properties of the eventual printed image beyond what can be obtained with a single application, or what can be obtained with multiple applications of the same printable material composition.

BRIEF DESCRIPTION OF THE DRAWING

FIG. 1 is a schematic illustration of one embodiment of an equipment system for carrying out the present invention, as described in the Examples below.

DETAILED DESCRIPTION OF THE INVENTION

Definitions

As used herein to define various components of the printable material compositions, formulations, and elastomeric compositions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, percentages refer to percents by total dry weight, for example, weight % based on total solids of a layer, composition, or formulation. Unless otherwise indicated, the percentages can be the same for either the dry layer or the total solids of the formulation or composition used to make that layer.

The term "flexographic printing precursor" refers to some embodiments of elastomeric relief elements useful in the practice of this invention. The flexographic printing precursors include flexographic printing plate precursors, flexographic printing sleeve precursors, and flexographic printing cylinder precursors, all of which can be suitably imaged to provide a relief image to have an average relief image depth of at least 50 μm and up to and including 1000 μm, or at least 100 μm and up to and including 600 μm, relative to the uppermost relief surface. Any desired minimum and maximum relief image depths can be achieved based on a given elastomeric relief element and the printed pattern that is desired. Such elastomeric relief elements can also be known as "flexographic printing plate blanks", "flexographic printing cylinder blanks", or "flexographic sleeve blanks". The elastomeric relief elements can also have seamless or continuous forms.

The term "laser-engraveable" means that a layer can be directly imaged using a suitable laser-engraving source including carbon dioxide lasers and near-infrared radiation lasers such as Nd:YAG lasers, laser diodes, and fiber lasers. Absorption of energy provided by these lasers produces heat that causes rapid local changes in a laser-engraveable layer so that the imaged regions are physically detached from the rest of the layer or substrate and ejected from the layer and collected using suitable means. Non-imaged regions of the laser-engraveable layer are not removed or volatilized to an appreciable extent and thus form the uppermost relief surface in the printing surface for printing. The breakdown is a violent process that includes eruptions, explosions, tearing, decomposition, fragmentation, oxidation, or other destructive processes that create a broad collection of solid debris and gases. This is distinguishable from image transfer. "Laser-ablative" and "laser-engraveable" can be used interchangeably in the art, but for purposes of this invention, the term "laser-engraveable" is used to define imaging in which a relief image is formed in the elastomeric relief element. It is distinguishable from image transfer methods in which ablation is used to materially transfer pigments, colorants, or other image-forming components.

The term "stacked" refers to multiple printable material compositions (first, second, and optionally more) that are applied one to another, in sequence, to form "multilayer structures" on the elastomeric relief element, which multilayer structures can then be transferred to a receiver element.

Uses

The method of this invention can be used in many ways to form a single multilayer structure of multiple different print materials on a suitable receiver element for use in devices and for components in a variety of applications including but not limited to, electronic, optical, sensory, and diagnostic devices. More details of such uses are provided below. A variety of active and inactive materials useful as the print materials can be applied as a multilayer structure to the receiver material using a suitable elastomeric relief element described herein.

In particular, it is desired to use the present invention to provide patterns of multilayer structures using multiple different print materials on the receiver elements comprising lines having a line resolution (line width) of less than 50 μm, or less than 15 μm, or even less than 10 μm and as low as 1 μm.

Such electronic and optical devices and components include but are not limited to, radio frequency tags (RFID), sensors, and memory and back panel displays. The method of this invention can be used to form multilayer structures of multiple different electrically conductive materials, semi-conductive materials, dielectric materials, or colorants (dyes or pigments). The patterns can be designed to be temperature-sensitive or pressure-sensitive as well.

For example, the method of this invention can be used to form single multilayer structure patterns of different biological materials and pharmacologically active materials on a receiver element for use in sensory or diagnostic applications.

The method can also form multiple print materials into a single pattern that forms barrier walls for cells or pixels to contain other materials, such as light emitting materials or color filter pigmented materials, or to form a pattern that defines the channel length between source electrode and drain electrode delivered from solution. The pattern of barrier walls can also be referred to as a confinement layer or barrier layer. The method of this invention can be used to form multiple print materials into a pattern that forms barrier walls that create cells for use as color filter pixels that can be filled with colorants for color filters, including dye and pigment colorants.

The present invention can also be used to form a single pattern of multiple print materials into transistor channels for top gate devices in which other materials, such as source materials and drain materials, are delivered to the channels. The method can form the print materials into transistor channels on a semiconducting layer of the receiver element for bottom gate devices in which source materials and drain materials are delivered to the channels. The other materials can be delivered into patterned cells on a receiver element by any means including ink jetting.

The present invention is also useful for providing electrically conductive patterns on receiver elements that are designed for use as touch panel displays. Such electrically conductive patterns can be provided using different print materials, such as metals and metallic salts that are or can be processed or treated in some manner to become electrically conductive. Useful print materials of this type include but are not limited to, silver and silver salts such as silver halides, and silver behenate and other organic silver salts.

Print Materials and Printable Material Compositions

In some embodiments, the term "print material" refers to a material that is capable of facilitating an operation in a component or device. In addition, a first or second print material can be a material that can be used for providing visual information as well as purposes other than simply providing visual information. The first or second print material can be an active or inactive material, and can be organic or inorganic in nature. Organic materials can be polymeric materials or non-polymeric small molecules, or oligomeric materials that are considered to be in between polymeric materials and non-polymeric small molecules.

"Active first or second print materials" include but are not limited to, electrically active materials, photoactive materials, and biologically active materials. As used herein, the terms "electrically active", "photoactive", and "biologically active" refer to print materials that exhibit a predetermined activity in response to a stimulus such as an electromagnetic field, an electrical potential, solar or other energy radiation, a biostimulation field, or any combination thereof.

"Inactive first or second print materials" include but are not limited to, insulating materials such as dielectric materials, planarization materials, barrier materials, and confinement materials. For example, a planarization material can be printed on top of a pattern of pixels in color filters to render all pixels the same height. A barrier material is a printed pattern that forms a barrier so that charges in the cathode facilitate charge injection into a light emitting polymer layer in an organic light emitting diode (OLED). A confinement material can be printed as a pattern that restricts the expansion of a subsequently applied liquid to a particular area that is defined by the pattern of confinement material.

First and second print materials include for example, electrically conductive materials, semi-conductive materials, and dielectric materials. Examples of electrically conductive materials include but are not limited to, conductive polymers, nanoparticles of indium-tin oxide, nanoparticles of metals such as gold, silver, copper, platinum, iridium, rhodium, and palladium, metal precursors such as silver precursors (such as silver salts), metal complexes, metal alloys, and combinations thereof. A first or second print material can alternatively be a conductive material precursor such as a metal salt (for example a silver salt like a silver halide or an organic silver salt), or an electroless metallization catalyst such as nanoparticles of silver or palladium. Particularly useful electrically conductive print materials include but are not limited to particles of silver (and silver precursors such as salts), gold, copper, palladium, platinum, nickel, and iron, indium-tin oxide, carbon blacks, and combinations thereof. Examples of useful electrically semi-conductive inorganic materials include but are not limited to silicon, germanium, gallium arsenide, zinc oxide, and zinc selenide, and combinations thereof.

Examples of useful electrically semi-conductive organic materials that can be used as print materials include N,N'-di(arylalkyl)-substituted naphthalene-based tetracarboxylic diimide compounds as described for example in U.S. Pat. No. 7,981,719 (Shukla et al.), N,N'-cycloalkyl-substituted naphthalene-based tetracarboxylic diimide compounds as described for example in U.S. Pat. No. 8,212,243 (Shukla et al.), and compositions also containing polymer additives as described for example in U.S. Patent Application Publication 2011-0183462 (Shukla et al.).

In addition, the photocurable inks described in U.S. Patent Application Publication 2012-0207935 (Shukla et al.) can be used as print materials.

Useful first or second print materials can also be compositions that can be polymerized by photoinitiation such as those described in U.S. Patent Application Publication 2012-0122664 (Shukla et al.).

Further, useful "precursor" print materials are amic acid or amic acid ester compositions as described for example in U.S. Patent Application Publication 2011-0269967 (Shukla et al.).

First and second print materials can be of any form including particulate, polymeric materials, small molecule materials, and other forms that would be apparent to a skilled worker. For example, useful electrically semi-conductive materials and dielectric materials can be used as particulate print materials. Useful particulate or film-forming polymeric print materials include electrically conductive polymers including but not limited to, homopolymers and copolymers comprising polythiophenes, polyanilines, polypyrroles, polycarbazoles, polyindoles, polyazepines, polyethylenedioxythiophenes, poly(3-alkylthiophenes), poly(p-phenylene vinylene)'s, poly(p-phenylene)'s, poly(styrene sulfonic acid) (PSS), poly(p-phenylene sulfide), polyacetylene, poly(3,4-ethylene dioxythiophene) (PEDOT), and a mixture of poly(styrene sulfonic acid) and poly(3,4-ethylene dioxythiophene) (PSS:PEDOT).

It is also possible that the first or second print materials are used in the form of nanoparticles. Nanoparticles are microscopic particles whose size is measured in nanometers (nm). Nanoparticles include particles having at least one dimension less than 200 nm and in some embodiments, the nanoparticles have an average diameter of at least 3 nm to and including 100 nm. The nanoparticles can be in the form of clusters. The shape of the nanoparticles is not limited and includes nanospheres, nanorods, and nanocups. Nanoparticles composed of electrically semi-conductive materials can also be known as quantum dots if the particles are small enough (usually less than 30 nm) that quantization of electronic energy levels occurs. Electrically conductive semi-conductive materials include light-emitting quantum dots. The first or second print materials include but are not limited to, semi-solid nanoparticles such as liposomes, soft nanoparticles, nanocrystals, and hybrid structures, such as core-shell nanoparticles. Moreover, the print materials also include nanoparticles of carbon such as carbon black, carbon nanotubes, electrically conducting carbon nanotubes, graphene, carbon black conducting polymers, and electrically semi-conducting nanotubes. Metal nanoparticles and dispersions of gold, silver, palladium, platinum, platinum, and copper are also useful in this invention.

The term "photoactive" print material is intended to mean any first or second print material that exhibits photoluminescence, electroluminescence, or photosensitivity. The term is intended to include at least dyes, optical whiteners, photoluminescent materials, compounds reactive to actinic radiation, and photoinitiators. For example, a photoactive print material can be a material or combination of materials that are capable of initiating one or more reactions, particularly photochemical reactions, upon response to suitable ultraviolet, visible, or infrared radiation. Photoactive print materials can include compounds that can be reactive to radiation or a composition comprising one or more compounds, such as monomers and photoinitiators that render the composition reactive to the radiation.

Further examples of first or second print materials can be referred to as small molecules and include but are not limited to, organic dyes, electrically semi-conducting molecules, fluorescent chromophores, phosphorescent chromophores, pharmacologically active compounds, biologically active compounds, silver halide compositions, and compounds having catalytic activities, that alone or in various combinations with other materials, are suitable for the fabrication of patterned devices useful for electronic, sensory, or diagnostic applications.

Biologically active print materials, which can also be called bio-based materials, for use in the present invention can include but are not limited to, deoxyribonucleic acids (DNA molecules) of various molecular weights that can be used as templates or scaffolds to position other materials that bind to DNA into well-defined geometries, and proteins, poly(oligo) peptides, and poly(oligo)saccharides, that alone or in various combinations with other materials, are suitable for the fabrication of patterned devices for electronic, sensory, or diagnostic application.

Thus, in many embodiments, the first or second printable material compositions used in this invention comprise a first or second print material, respectively, that is selected from the group consisting of electrically conductive materials, semi-conductive materials, dielectric materials, small molecule materials, polymeric materials, bio-based materials, electro luminescence materials, and combinations thereof.

More particularly, each printable material composition used in this invention can comprise a print material that comprises nanoparticles of an electrically conductive material selected from the group consisting of silver (or nanoparticles derived from silver precursor such as a silver salt), gold, copper, palladium, platinum, nickel, indium-tin oxide, or combinations thereof. For example, in some very useful embodiments, at least one of the first and second printable material compositions comprises a print material that comprises nanoparticles derived from an inorganic or organic silver salt such as a silver halide, silver behenate, and other silver salts that would be readily apparent to one skilled in the art.

It has been found particularly useful to use printable material compositions comprising a print material that comprises nanoparticles of a silver metal using an elastomeric relief element (described below) that is a flexographic printing member such as a flexographic printing plate.

In other embodiments, at least one of the first and second printable material compositions comprises a colorant including but not limited to, dyes, optical absorbers, pigments, opacifiers, and any material that modifies the transmissive or reflective property of a surface onto which the multilayer structure has been applied. This colorant can be the print material in a printable material composition, or it can be an additional component.

In general, each print material can be dispersed, dissolved, or suspended in a suitable carrier liquid, forming a printable material composition for application to a receiver material using the elastomeric relief element described herein. The carrier liquid used for each printable material composition is not limited and can include organic compounds and aqueous compounds. For example, the carrier liquid can be an organic compound that is an alcohol-based compound. The carrier liquid can be a solvent that is capable of dissolving or dispersing another substance such as one or more print materials to form a uniform solution or dispersion, or it can be a compound capable of dispersing or suspending the print material in solution sufficient to carry out the method of this invention.

The carrier liquid and the print material should at least be capable of wetting at least the uppermost relief surface of the elastomeric relief element during the method of this invention. The carrier liquid can have some volatility, and can also cause a certain amount of swelling in the elastomeric relief element, depending upon the type of composition from which the elastomeric relief element is prepared. Any swelling in the elastomeric relief element can be reduced when the carrier liquid is removed from the printable material composition. In addition, it is advantageous to use a carrier liquid that will not attack or adversely affect the stability and dimensional size of the elastomeric relief element or receiver element. A skilled worker can readily make a judicious choice of carrier liquid depending upon the materials used for the elastomeric relief element and the receiver element, and the particular print material to be printed (is swellability, solubility and other desired properties).

The carrier liquid can also include one or more compounds as a solvent for the print material. For example, the carrier liquid can include one or more solvents for the print material. In other embodiments, the carrier liquid comprises two or more solvents, for example a co-solvent mixture, for the print material. The solvent mixtures can be chosen using various criteria such as the evaporation rate (volatility) of the individual solvents, and the solvating power of the individual solvent components for a particular print material. Further details of such solvents are provided in paragraph [0046] of U.S. Patent Application 2008/0233280 (noted above).

Representative useful carrier liquid solvents include but are not limited to, alcohols (such as isopropyl alcohol, 2-ethyl hexanol, and α-terpenol), acetates (such as ethyl acetate), water, hydrocarbons (such as toluene and cyclohexane), and combinations of miscible solvents.

In general, each printable material composition comprising the carrier liquid and print material has a viscosity of at least 1 cps and up to and including 1500 cps, or typically of at least 200 cps and up to and including 900 cps, or up to and including 1000 cps. Some highly viscous printable material compositions can be used in the practice of this invention, and have a viscosity of at least 1500 cps to and including 5000 cps. Viscosity can be measured using a conventional means and equipment such as a Brookfield Viscometer DV-II+Pro (Brookfield Engineering Laboratories).

Some particularly useful print materials include but are not limited to, electrically conductive inks containing electrically conductive particles such as metal flakes or particles. Electrically conductive inks include electrically conductive silver-containing inks (such as inks comprising silver nanoparticles), gold-containing inks, copper-containing inks, carbon-containing inks, palladium-containing inks, nickel-containing inks, platinum-containing inks, and inks containing "seed" materials for electroplating or electroless plating. Some of such inks can be obtained commercially from sources such as InkTec (California), Flint Ink Corporation (Michigan), and Method Development Company (Chicago). Some of these "inks" can be used as a carrier liquid while other inks comprise both a carrier liquid and a print material.

Thus, such printable material compositions (or "inks") can comprise print materials that are dissolved or suspended in suitable carrier solvents as described above and that are known in the art for this purpose. For example, a silver-containing electrically conductive printable material composition can include any useful amount of silver metal particles that are dispersed in aqueous or non-aqueous carrier solvents.

In some embodiments, the printable material composition can further comprise a colorant besides the print material (such as an electrically conductive print material). Such colorants can include but not limited to, dyes, optical absorbers, pigments, opacifiers, and any material that modifies the transmissive or reflective property of the printable material composition at any time during the method of this invention.

Elastomeric Relief Elements

The elastomeric relief elements used in this invention can be comprised of one or more elastomeric layers, with or without a substrate, in which a relief image can be generated using suitable imaging means. For example, the relief layer comprising a relief pattern can be disposed on a suitable substrate.

For example, the elastomeric relief element (for example, flexographic printing member) having a relief layer comprising an uppermost relief surface and an average relief image depth (pattern height) of at least 50 μm, or typically having an average relief image depth of at least 100 μm relative from the uppermost relief surface, can be prepared from imagewise exposure of an elastomeric photopolymerizable layer in an elastomeric relief element precursor such as a flexographic printing member precursor, for example as described in U.S. Pat. No. 7,799,504 (Zwadlo et al.) and U.S. Pat. No. 8,142,987 (Ali et al.) and U.S. Patent Application Publication 2012/0237871 (Zwadlo), the disclosures of all of which are incorporated herein by reference with respect to details of the flexographic printing member precursors. Such elastomeric photopolymerizable layers can be imaged through a suitable mask image to provide an elastomeric relief element (for example, flexographic printing plate or flexographic printing sleeve). In some embodiments, the relief layer comprising the relief pattern can be disposed on a suitable substrate as described in the noted Ali et al. patent. Other useful materials and image formation methods (including development) for provide elastomeric relief images are also described in the noted Ali et al. patent.

In other embodiments, the elastomeric relief element is provided from a direct (or ablation) laser-engraveable elastomer relief element precursor, with or without integral masks, as described for example in U.S. Pat. No. 5,719,009 (Fan), U.S. Pat. No. 5,798,202 (Cushner et al.), U.S. Pat. No. 5,804,353 (Cushner et al.), U.S. Pat. No. 6,090,529 (Gelbart), U.S. Pat. No. 6,159,659 (Gelbart), U.S. Pat. No. 6,511,784 (Hiller et al.), U.S. Pat. No. 7,811,744 (Figov), U.S. Pat. No.

7,947,426 (Figov et al.), U.S. Pat. No. 8,114,572 (Landry-Coltrain et al.), U.S. Pat. No. 8,153,347 (Veres et al.), U.S. Pat. No. 8,187,793 (Regan et al.), and U.S. Patent Application Publications 2002/0136969 (Hiller et al.), 2003/0129530 (Leinenback et al.), 2003/0136285 (Telser et al.), 2003/0180636 (Kanga et al.), and 2012/0240802 (Landry-Coltrain et al.).

However the relief image is provided, its elastomeric relief layer is designed such that the elastomeric relief element has a modulus of elasticity of at least 2 megaPascals but less than 10 megaPascals, or typically of at least 4 megaPascals and up to and including 8 megaPascals, as determined for example, using a Digital Durometer HPE-II Series (Qualitest USA LC), Instron Model 5942 Single Column Table Top Materials Testing System, Texture Technologies TA-XT2i Benchtop Materials Tester, or Rheometrics Solids Analyzer Model RSAII DMA, particularly when the elastomeric relief element is a flexographic printing member. The relationship between Shore A hardness (indentation) and Young's Modulus is described by A. N. Gent, "On the Relation between Indentation Hardness and Young's Modulus", Rubber Chemistry and Technology: September 1958, Vol. 31, No. 4, pp, 896-906, 1958.

As noted above, average relief image depth (relief pattern) or an average relief pattern depth in the relief pattern is at least 50 µm or typically at least 100 µm relative to the uppermost relief surface, especially when the elastomeric relief element is a flexographic printing member. A maximum relief image depth (relief pattern) or relief pattern height can be as great as 1,000 µm, or typically up to and including 750 µm, relative to the uppermost relief surface. The relief pattern generally has a shoulder angle of greater than 25° and up to and including 85°, or typically at least 50° and up to but not equal to 75°, relative to a vertical line from the lowest recess to the uppermost relief surface (that is, the higher should angle of 85° would be closer to the horizontal dimension parallel with the uppermost relief surface). Shoulder angle can be measured as described in FIG. 4 of U.S. Pat. No. 7,799,504 (noted above) the disclosure of which is incorporated herein by reference for the description of the shoulder angle.

Methods for Forming Patterns

The method of this invention uses the elastomeric relief element described herein to print a suitable pattern of multiple print materials in a multilayer structure on a receiver element. The present invention enables printing of a variety of multiple print materials over relatively large areas with desirable resolution (for example, a line width of less than 20 µm or even less than 15 µm). In some embodiments, where one of the print materials is an electrically conductive print material, the resolution (line width) can be as low as 5 µm or even as low as 1 µm. The method also provides a means for printing of sequential overlying patterns without hindering the utility of one or more underlying layers. The method can be adapted to high-speed production processes for the fabrication of electronic devices and components.

Printable material compositions (for example, the first and second printable material compositions) containing the different print materials (for example, the first and second print materials) can be applied in a suitable manner to the uppermost relief surface (raised surface) in the elastomeric relief element. Application of the different printable material compositions can be accomplished using several suitable means and it is desirable that as little as possible is coated onto the sides (slopes) or recesses of the relief depressions. Thus, it is desirable that as much as possible of the multiple different printable material compositions are applied only to the uppermost relief surface. Anilox roller systems or other roller application systems, especially low volume Anilox rollers, below 2.5 billion cubic micrometers per square inch (6.35 billion cubic micrometers per square centimeter) and associated skive knives are used in flexographic printing presses are particularly advantageous for this application of the different printable material compositions. Spin coating techniques and dip coating techniques are generally not suitable for this application because a printable material composition can be spread onto the sides of the elastomeric relief element relief features and even onto the floor or non-printing areas of the elastomeric relief element. Optimum metering of the printable material compositions onto the uppermost relief surface only can be achieved by controlling each printable material composition viscosity or thickness, or choosing an appropriate application means.

As noted above, each of the first and second printable material compositions independently have a viscosity during this application of at least 1 cps (centipoise) and up to and including 1500 cps, or at least 1 cps and up to and including 1000 cps.

The first and second printable material compositions (and any additional printable material compositions) can be each applied, in sequence, at any time after the relief image is formed within a relief element precursor. Each printable material composition can be applied by any suitable means, including the use of an Anilox roller system, which can be one of the most useful ways for application to the uppermost relief surface. The thickness of each functional material composition on the relief image is generally limited to a sufficient amount that is useful to prepare the multilayer structure that is eventually transferred to the receiver element, but not too much to flow over the edges of the relief element in the recesses when the multilayer structure is applied to the relief element.

After each printable material composition has been applied to the uppermost relief surface (or raised surface) of the relief element, at least 25 weight % of the original carrier liquid is removed from the applied printable material composition on the uppermost relief surface of the elastomeric relief element. In most embodiments, at least 50 weight % of the carrier liquid is removed from each printable material composition (include first and second printable material compositions) on the uppermost relief surface of the elastomeric relief element, or typically at least 75 weight %, or even at least 80 weight %, of the carrier liquid is removed. Thus, the carrier liquid of each printable material composition can be removed sufficiently to form a film of the functional material on at least the uppermost relief surface of the relief image. Carrier liquid removal can be achieved in any manner, for example using jets of hot air, evaporation at room temperature, or heating in an oven at an elevated temperature, or other means known in the art for removing a solvent. In one embodiment, the liquid can be removed by drying during and after the application of each printable material composition to the uppermost relief surface. Effective drying can be assisted by selecting a carrier solvent(s) that has a relatively low boiling point or by application of a thinner layer of each printable material composition.

Thus, the method of this invention comprises applying a first printable composition to the uppermost relief surface of the elastomeric relief element, the first printable material composition comprising a first print material and a carrier liquid. At least 50 weight % (or at least 80 weight %) of the carrier liquid can then be removed from the first printable material composition using the procedures described above.

After this carrier liquid removal, the second printable material composition is applied to the first print material on the uppermost relief surface of the uppermost relief surface. This second printable material composition comprises a second print material and a carried liquid, but it is essential that the second print material be different from the first print material, at least compositionally. At least 50 weight % (or at least 80 weight %) of the carrier liquid in the second printable material composition can then be removed using the procedures described above.

For example, useful first print materials that can be used in this invention include but are not limited to, any of the print materials described above, but particularly useful first print materials are independently nanoparticles of an electrically conductive material selected from the group consisting of silver or a silver salt, gold, copper, palladium, platinum, nickel, iron, indium-tin oxide, carbon black, and combinations thereof.

In addition, useful second print materials include but are not limited to, any of the print materials described above, but particularly useful second print materials include but are independently nanoparticles of an electrically conductive material selected from the group consisting of silver (for example, derived from a silver salt), gold, copper, palladium, platinum, rhodium, iridium, nickel, iron, indium-tin oxide, carbon black, and combinations thereof.

In some embodiments, the first print material can be selected from the group consisting of nanoparticles of silver, gold, palladium, nickel, and platinum, and the second print material is chosen to be less reflective than the first print material. For example, such a second print material can be a carbon black.

In other embodiments, the first print material is less reflective than the second print material. For example, in such embodiments, the first print material can be carbon black and the second print material can be selected from the group consisting of nanoparticles of silver or a silver salt, gold, palladium, nickel, copper, and platinum.

These method features described herein can be used to provide a printing member comprising:

(a) an elastomeric relief element that comprises a relief pattern comprising (1) an uppermost relief surface, and (2) an average relief image depth of at least 50 µm relative to the uppermost relief surface, and (b) a multilayer structure disposed on the uppermost relief surface, the multilayer structure comprising, in order from the uppermost relief surface: (i) a first printable material composition comprising a first print material, and (ii) a second printable material composition comprising a second print material, wherein the first print material and the second print material are different at least compositionally.

Additional printable material compositions can be used in combination with the first and second printable material compositions to provide a printing member of this invention. Such additional printable material compositions can be applied to the multilayer structure after both first and second multilayer compositions have been applied, or they can be used between the application of the first and second printable material compositions. For example, two or more applications of the first printable material composition can be made to the elastomeric relief element prior to one or more applications of the second printable material composition. Alternatively, one or more additional printable material compositions can be applied between application of the first and second printable material compositions, which additional printable material compositions comprise a print material that is different from both the first and second print materials, at least compositionally.

The additional printable material compositions can be prepared similarly to the first and second printable material compositions. In addition, each application of an additional printable material composition can be immediately followed with removal of at least 50 weight % (or at least 75 weight %) of the carrier liquid as described above for the first and second printable material compositions.

The carrier liquids used in the first, second, and optional additional printable material compositions can be the same or different and can be chosen from the suitable carried liquids described above. In some embodiments, the same carrier liquid is used in all of the printable material compositions (including the first and second printable material compositions) used in the practice of the method of this invention.

In some embodiments, the cycle of a) applying the first printable material composition to the uppermost relief surface of the elastomeric relief element, b) removing at least 50 weight % of the carrier liquid from the first printable material composition, c) applying the second printable material composition to the first print material on the uppermost relief surface, and d) removing at least 50 weight % of the carried liquid from the second printable material, in this sequence, can be repeated at least once, using an additional amount of the same first and second printable material compositions and the same elastomeric relief element, in each cycle. This use of multiple cycles disposes an increased amount of both first and second print materials on the uppermost relief surface, and increases the optical density of the resulting pattern of first and second print materials on the receiver element, for example to provide an average density of at least 3.5 as measured by an X-Rite 360 spectrophotometer, or it can increase the electrical conductivity of the resulting pattern. The repetition of the noted cycle can also maintain printed feature resolution and continuity while filling any potential voids in the desired printed regions of the pattern. There can be sufficient time between multiple cycles so that sufficient amounts of carrier liquid can be removed using any suitable means of solvent removal as described above.

The result of all of these method features is a printing member as described above comprising first and second print materials, and optionally any additional print materials in a multilayer structure, in which the first print material is closest to the uppermost relief surface and the last applied print material is outermost in the multilayer structure.

Prior to or after applying the first and successive print materials to form the multilayer structure, the elastomeric relief element, with or without the multilayer structure, can be treated with an acid in vapor or liquid form. For example, this treatment can be carried out using nitric acid, acetic acid, or hydrochloric acid in vapor or liquid form.

Such acid treatment can be carried out in any suitable manner including immersing the entire elastomeric relief element in an acidic solution of any suitable concentration that will not adversely affect the elastomeric relief element (for example at least 0.001 molar and up to and including 1.0 molar acid solution), wiping the acidic solution over the relief image, or spraying the acidic solution onto the relief image. Alternatively, the relief image can be contacted with an acid in vapor form. The various acidic contacting can be carried out for any suitable length of time, for example at least 0.1 seconds and up to and including 5 minutes, and at a suitable temperature of for example room temperature (about 20° C. and up to and including 80° C. For example, when the acid is provided in liquid form, the printable material composition can be treated with a solution of the acid (for example hydrochloric acid) at a concentration of at least 0.01 molar for at least 1.0 seconds at a temperature of at least 20° C. When an acidic vapor is used, the treatment time can be at least 0.5 seconds and carried out at a temperature of at least 20° C.

A receiver element is provided on which a desired pattern is formed using the elastomeric relief element. This receiver element can be composed of any suitable material including but are not limited to, polymeric films, metals, silicon or ceramics, fabrics, papers, and combinations thereof (such as laminates of various films, or laminates of papers and films) provided that a pattern of the multilayer structure can be formed thereon. The receiver element can be transparent or opaque, and rigid or flexible. The receiver element can include one or more polymeric or non-polymeric layers or one or more patterns of other materials before the pattern of print material is applied according to the present invention. The surface of the receiver element can be treated for example with a primer layer or mechanical treatments (such as graining) to provide a "receptive surface" and to promote adhesion of the multilayer structure or to promote adhesion of a separate adhesive layer on the receiver element substrate. An adhesive layer can be disposed on a substrate in the receiver element and this adhesive layer can have various properties in response to heat (thermally activatable, solvent activatable, or chemically activatable) that aids in the transfer or adhesion of the pattern of multilayer structure. Useful adhesive materials of this type are described for example in [0057] of U.S. Patent Application 2008/0233280 (noted above).

In most embodiments, the receiver element comprises a receptive layer as a receptive surface on a substrate, which receptive layer and substrate can be composed of a material such as a suitable polymeric material that is highly receptive of the multilayer structure. In particular, the receptive layer is chosen from the materials described above that are receptive to the multilayer structure that forms the desired pattern on the receiver element with high resolution. Such receptive layer generally has a dry thickness of at least 0.05 µm and up to and including 10 µm, or typically at least 0.05 µm and up to and including 3 µm, when measured at 25° C.

The substrates of the receiver element can be surface-treated by exposure to corona discharge, mechanical abrasion, flame treatments, or oxygen plasmas, or by coating with various polymeric films, such as poly(vinylidene chloride) or an aromatic polysiloxane as described for example in U.S. Pat. No. 5,492,730 (Balaba et al.) and U.S. Pat. No. 5,527,562 (Balaba et al.) and U.S. Patent Application Publication 2009/0076217 (Gommans et al.) to provide a desired receptive surface.

Suitable substrates in the receiver elements include but are not limited to, metallic films or foils, metallic films on polymer, glass, or ceramic supports, metallic films on electrically conductive film supports, semi-conducting organic or inorganic films, organic or inorganic dielectric films, or laminates of two or more layers of such materials. For example, useful substrates can include indium-tin oxide coated glass, indium-tin oxide coated polymeric films, poly(ethylene terephthalate) films, poly(ethylene naphthalate) films, polyimide films, polycarbonate films, polyacrylate films, polystyrene films, polyolefin films, polyamide films, silicon, metal foils, cellulosic papers or resin-coated or glass-coated papers, glass or glass-containing composites, ceramics, metals such as aluminum, tin, and copper, and metalized films. The receiver element substrate can also include one or more charge injection layers, charge transporting layers, and semi-conducting layers as a receptive surface onto which the multilayer structure pattern is formed.

Particularly useful substrates are polyesters films such as poly(ethylene terephthalate), polycarbonate, or poly(vinylidene chloride) films that have been surface-treated as noted above, or coated with one or more suitable adhesive or subbing layers, the outer layer being receptive to the multilayer structure composition. A useful outer layer can be a vinylidene chloride polymer containing layer.

Useful substrates can have a desired dry thickness depending upon the eventual use of the receiver element, for example for incorporation into various articles or devices (for example optical devices or optical panels). For example, the dry thickness can be at least 0.001 mm and up to and including 10 mm, and especially for polymeric films, the dry thickness can be at least 0.008 mm and up to and including 0.2 mm.

While it is not essential for all embodiments, it is often desirable that before contact of the receiver element with the multilayer structure, the receiver element is heated. When the receiver element is heated, it is heated to a heating temperature that is higher than the glass transition temperature ($T_{gl}$) of the receptive layer to form a heated receiver element. Glass transition temperatures can be determined using Differential Scanning calorimetry. In general, the receiver element can be heated to a heating temperature that is at least 10° C. higher than the $T_{gl}$. For example, the receiver element can be heated to a heating temperature that is higher than $T_{gl}$ by at least 10° C. and up to and including 100° C. before significant distortion or decomposition of the heated receiver element. The time and manner for this heating and manner would be readily determined by a skilled worker, for example using a suitable heating oven or hot surface. In some embodiments such as when the heated receiver element is heat-stabilized poly(ethylene terephthalate), poly(ethylene naphthalate), or polyamide (such as Kapton), the $T_{gl}$ is at least 20° C. or at least 25° C. lower than the glass transition temperature of the substrate ($T_{gs}$). The receiver element can be provided in already heated form, and either used as provided or heated further.

In general, the receiver element can be heated to a temperature that is lower than the glass transition of the receiver element substrate ($T_{gs}$) by at least 5° C. and that is higher than $T_{gl}$ by at least 10° C.

Heated or not, the receiver element and multilayer structure disposed on the uppermost relief surface of the elastomeric relief element are contacted such that the elastomeric relief element is compressed by at least 10 µm of its original thickness ("compression distance") or at least 50 µm and up to and including 200 µm of the original thickness. This original thickness is that of only the elastomeric relief element, and does not include any supporting means or surface, such as mounting tape, underneath the elastomeric relief element. The total thickness of the elastomeric relief element can be at least 0.4 mm or even at least 2 mm. The compression distance is generally greater for thicker elastomeric relief elements. The numbers noted above are generally for elastomeric relief elements having a total thickness of about 1.1 mm. Because some of the carrier liquid is removed and the multilayer structure flows minimally during this contact procedure in the present invention, a higher impression distance or compression pressure can be used compared to conventional flexography.

In this manner, the multiple print materials in the multilayer structure (with reduced carrier liquid) disposed on the uppermost relief surface are forced into contact (laminated or embossed with) with the receiver element. In general, if the receiver element is heated, it and elastomeric relief element can be brought into contact very soon after the heating, for example, within 10 milliseconds so that the heated receiver element has minimal time to cool. Alternatively, the receiver element can be maintained at a desired temperature before and during the contact with the elastomeric relief element using suitable heating and thermal insulation means. When heating is used to remove the carrier liquid from the printable material composition, some of the residual heat is present during transfer of the multilayer structure.

The transfer pressure can be applied to either the elastomeric relief element or the receiver element to assure contact and complete transfer of the multilayer structure to the receiver surface of the receiver element. For example, transfer of the multilayer structure can be carried out by moving the uppermost relief surface of the elastomeric relief element relative to the receiver surface of the receiver element, by moving the receiver element relative to the uppermost relief surface of the elastomeric relief element, or by relative movement of both elements to each other. In some embodiments, the multilayer structure is transferred to the receiver element manually. In other embodiments, the transfer is automated such as by example, by a conveyor belt, reel-to-reel process, directly driven moving fixtures, chain, belt, or gear-driven fixtures, frictional roller, printing press, or rotary apparatus, or any combination of these methods.

The receiver element and elastomeric relief element can be kept in contact for as little as 10 milliseconds or up to 10 seconds or as much as 60 seconds or more. Once the desired contact is completed, the elastomeric relief element is separated from the receiver element to leave a desired pattern of the multiple print materials (multilayer structure) on the receiver element (which can begin to cool, or it can be maintained at any suitable temperature to provide additional heat treatment such as from curing the multilayer structure). It is desirable that at least 70 weight % of the multilayer structure that was originally disposed on the uppermost relief surface of the elastomer relief element is transferred to the receiver element in a desired pattern. In most embodiments, at least 90 weight % and up to and including 100 weight % of the originally disposed multilayer structure is transferred to the receiver element.

Separation of the elastomeric relief element and the receiver element can be accomplished using any suitable means including but not limited to, manual peeling apart, impingement of gas jets or liquid jets, or mechanical peeling devices.

In general, transferring the multilayer structure from the raised uppermost relief surface of the elastomeric relief element to the receptive surface of the receiver element creates a pattern of the multilayer structure on the receiver element. The transferring can be referred to as "printing" (or lamination or embossing). The pattern of the multilayer structure on the receiver element can comprise lines, solid areas, dots, or a mixture of large or fine lines and solid areas in any desired pattern that text, numbers, shapes, or other images, or combinations thereof. In general, the average line width for printed lines in the pattern of multilayer structure on the receiver element can be less than 20 μm or even less than 15 μm and as wide as 2 μm. Such lines can also have an average height of at least 10 nm and up to and including 4,000 μm. These average dimensions can be determined by measuring the lines in at least 10 different places and determining the width or height using known image analysis tools including but not limited to, profilometry, optical microscopic techniques, atomic force microscopy, and scanning electron microscopy.

While a particularly useful method of applying the multilayer structure to the receiver element includes the use of flexography and the elastomeric relief element is a flexographic printing member comprising a relief image, the multilayer structure can also be applied to a receiver element using alternative appropriate printing methods that would be readily apparent to one skilled in the art using the teaching provided herein.

The method of this invention can be carried out at room temperature such as at least 17° C. and up to and including 30° C. but is not so limited, as it can be carried out at a lower temperature down to about 5° C., or at an elevated temperature up to 200° C. provided that the heat does not harm the elastomeric relief element, the multiple print materials, the receiver element, or their ability to form a multilayer structure pattern on the receiver element.

In some of the embodiments, the method of this invention provides a printed pattern of the multilayer structure comprising fine lines of multiple print materials (multilayer structure) containing one or more seed materials for a subsequent electroless plating process. For example, for copper electroless plating, such seed materials include but are not limited to, electroless seed metals such as palladium, tin, nickel, copper, platinum, and silver, a mixture of tin and palladium, or other mixtures known in the art.

For example, the method of this invention can be used to provide a pattern of a multilayer structure that is protective of an underlying uniform metal film during a subsequent etching process.

In other embodiments, the method of this invention can be used to provide a pattern of fine lines of a multilayer structure having an electrical conductivity that is high enough for a subsequent electroplating process. Such an electrical conductivity is at least 0.1 S/cm and the details of such processes are known in the art.

After the pattern of multilayer structure has been applied to the receiver element in a suitable manner, the pattern can be further treated if desired using heat or exposure to actinic radiation (such as UV, visible, or IR radiation). For example, if the multilayer structure contains metal nanoparticles, the pattern of the multilayer structure can be heated to sinter the particles and render the pattern lines or shapes conductive. Sintering provides a coherent bonded mass from heating a metal powder in the form of metal nanoparticles, without melting. Sintering can be carried out using temperatures and conditions that would be apparent to one skilled in the art. The pattern of the multilayer structure can alternatively be chemically treated to change its properties, such as conductivity, color, or reflectivity using conditions, materials, and procedures that would be readily apparent to one skilled in the art.

The method of the present invention can be designed so that the pattern of the multilayer structure applied to the receiver element has an average optical density of at least 3.5.

The result of the described operations is a printed receiver element comprising:

a receptive layer having disposed thereon a printed pattern comprising a printed multilayer structure that comprises, in order from the receptive layer, (1) a second print material, (2) a first print material, and optional (3) additional print materials.

The present invention provides at least the following embodiments and combinations thereof, but other combinations of features are considered to be within the present invention as a skilled artisan would appreciate from the teaching of this disclosure:

1. A method for forming a pattern of a print material on a receiver element comprising a print material receptive layer, the method comprising:

providing an elastomeric relief element that comprises a relief pattern comprising (1) an uppermost relief surface, and (2) an average relief image depth of at least 50 μm relative to the uppermost relief surface, applying a first printable material composition to the uppermost relief surface of the elastomeric relief element, the first printable material composition comprising a first print material and a carrier liquid, removing at least 50 weight % of the carrier liquid from the first printable material composition that is disposed on the uppermost relief surface of the elastomeric relief element, leaving the first print material on the uppermost relief surface, applying a second printable material composition to the first print material on the uppermost relief surface of uppermost relief surface, the second printable material comprising a second print material and a carrier liquid, removing at least 50 weight % of the carrier liquid from the second printable material composition, forming a multilayer structure comprised of the second print material disposed on the first print material, on the uppermost relief surface, and transferring the multilayer structure from the uppermost relief surface to a receptive surface of a receiver element, wherein the first print material and the second print material are different at least compositionally.

2. The method of embodiment 1, comprising removing at least 80 weight % of the carrier liquid from each of the first and second printable material compositions on the uppermost relief surface of the elastomeric relief element.

3. The method of embodiment 1 or 2, wherein the first and second printable material compositions independently have a viscosity of at least 200 cps and up to and including 900 cps.

4. The method of any of embodiments 1 to 3, wherein the elastomeric relief element is a flexographic printing member and the relief pattern has an average relief image depth of at least 100 μm relative to the uppermost relief surface.

5. The method of any of embodiments 1 to 4, comprising providing the elastomeric relief element by imagewise exposing an elastomeric photopolymerizable layer through a mask image.

6. The method of any of embodiments 1 to 5, wherein the first and second print materials are independently nanoparticles of an electrically conductive material selected from the group consisting of silver, gold, copper, palladium, platinum, nickel, iron, indium-tin oxide, carbon black, and combinations thereof.

7. The method of any of embodiments 1 to 6, wherein at least one of the first and second printable material compositions comprises a colorant.

8. The method of any of embodiments 1 to 7, wherein the first and second print materials are independently selected from the group consisting of electrically conductive materials, semi-conductive materials, dielectric materials, small molecule materials, polymeric materials, bio-based materials, electro luminescence materials, and combinations thereof.

9. The method of any of embodiments 1 to 8, wherein the elastomeric relief element comprises a relief layer comprising the relief pattern, which relief layer is disposed on a substrate.

10. The method of any of embodiments 1 to 9 for providing a pattern of the multilayer structure on the receiver element comprising lines having an average line width of less than 15 μm.

11. The method of any of embodiments 1 to 10 for providing a pattern of a multilayer structure that comprises a seed material for a subsequent electroless plating process.

12. The method of any of embodiments 1 to 11, wherein the first print material is selected from the group consisting of nanoparticles of silver, gold, palladium, nickel, and platinum, and the second print material is less reflective than the first print material.

13. The method of embodiment 12, wherein the second print material comprises carbon black.

14. The method of any of embodiments 1 to 13, wherein the first print material is less reflective than the second print material.

15. The method of any of embodiments 1 to 11, wherein the first print material is carbon black and the second print material is selected from the group consisting of nanoparticles of silver, gold, palladium, nickel, copper, and platinum.

16. The method of any of embodiments 1 to 15, further comprising heating the receiver element before transferring the multilayer structure from the uppermost relief surface to the receptive surface of the receiver element, the heating being to a heating temperature that is higher than the glass transition temperature ($T_g$) of the receptive layer.

17. The method of embodiment 16, comprising transferring the multilayer structure from the uppermost relief surface to the receptive surface in a manner such that the elastomeric relief element is compressed by at least 10 μm of its original thickness.

18. The method of any of embodiments 1 to 17, further comprising separating the elastomeric relief element from the receiver element to leave a pattern of the multilayer structure on the receiver element, wherein at least 70 weight % of the multilayer structure originally disposed on the uppermost relief surface of the elastomeric relief element is transferred to the receiver element.

19. The method of any of embodiments 1 to 18, wherein the relief pattern in the elastomeric relief element has an average relief image depth of at least 100 μm relative to the uppermost relief surface, and a shoulder angle of at least 50° and up to but not equal to 75° from vertical.

20. The method of any of embodiments 1 to 19, wherein the pattern of the multilayer structure on the receiver element has an average optical density of at least 3.5.

21. A printing member used in carrying out any of embodiments 1 to 20, the printing member comprising:

(a) an elastomeric relief element that comprises a relief pattern comprising (1) an uppermost relief surface, and (2) an average relief image depth of at least 50 μm relative to the uppermost relief surface, and (b) a multilayer structure disposed on the uppermost relief surface, the multilayer structure comprising, in order from the uppermost relief surface: (i) a first printable material composition comprising a first print material, and (ii) a second printable material composition comprising a second print material, wherein the first print material and the second print material are different at least compositionally.

22. A printed receiver element formed from any of the embodiments 1 to 20, and optionally using the printing member of embodiment 20, the printed receiver element comprising:

a receptive layer having disposed thereon a printed pattern comprising a printed multilayer structure that comprises, in order from the receptive layer, (1) a second print material, and (2) a first print material.

The following Examples are provided to illustrate the practice of this invention and are not meant to be limiting in any manner. Unless otherwise indicated, the following procedure and conditions were used for all of the illustrated examples.

These examples are carried out to provide printed conductive silver patterns on a flexible polymeric substrate (coated or non-coated) using samples of flexographic printing plate precursors prepared as described in U.S. Pat. No. 8,142,987 (noted above) that were imaged to provide a relief pattern in a flexographic printing plate as an elastomeric relief element, using a high resolution imaging device.

Each sample of Flexcel™ NX flexographic printing plate precursor having a 1.14 mm total dry thickness, was provided as an elastomeric relief element and imaged to provide a relief pattern having an uppermost relief surface and an average relief image depth of 250 µm containing grid features spaced 400 µm apart and a line width of 6 µm. Each elastomeric relief element was then mounted using 3M brand 1120 adhesive-backed tape onto the plate cylinder of a Flexiproofer™ 100 flexographic printer (obtained from RK PrintCoat Instruments, Ltd., United Kingdom). The total outer diameter of the plate cylinder assembly was 128.5 mm.

A specific ink (printable material composition), as described below and comprising a print material and a carrier liquid, was applied to the uppermost relief surface of each elastomeric relief element using a 1.6 BCM, 1600 lpi Anilox roller at a speed of 50 meters/minute and impression distance of 50 µm. Each ink (printable material composition) had a viscosity of at least 100 cps at room temperature, and was applied multiple times to each elastomeric relief element with an 8 second wait between each ink application to allow room temperature drying of the ink (removing at least 75 weight % of the carrier liquid) after each application.

In this invention, the second, third or fourth application can be carried out using different inks (different printable material compositions) having different qualities (for, example different composition) in order to transfer "in register" the print materials in the desired printed multilayer structure. This application could be used to transfer "in register" a conductive silver ink (printable material composition) and also a black ink (printable material composition) in desired order, for example to incorporate the black ink above, below, or in between multiple applications of the reflective silver ink, and in the case of fine lines to enable the grid to become less visible. Another purpose of such multiple applications of printable material compositions would be to enable an adhesive to be applied as the last "ink" (layer) in the multilayer structure and therefore allow the multilayer structure to be more easily transferred to a receiver element such as a coated or uncoated PET receiver element.

After the last application of ink (printable material composition), the plate cylinder with the attached elastomeric relief element was removed and impressed against a provided receiver element that had been heated. Each receiver element comprised a polymer-coated poly(ethylene terephthalate) (PET) film and each polymer coating is described below. Unless noted otherwise, each polymer coating had been applied to the PET film at a coverage of either 50 mg/ft$^2$ (540 mg/m$^2$) or 30 mg/ft$^2$ (324 mg/m$^2$)].

"HD" refers to a vinylidene chloride polymer latex coating, for example that is commonly used in preparing photographic silver halide films, the composition of which would be known in the art.

Butvar® B76 is a commercial poly(vinyl butyral) that can be obtained from various commercial sources including Solutia, Inc. (Indian Orchard, Mass.), now a subsidiary of Eastman Chemical Company (Kingsport, Tenn.).

PVDC refers to a vinylidene chloride polymer that can be applied from an organic solvent.

Elvacite® E2014 and E2044 are commercially available acrylate polymers that are available from Lucite International.

Carboset™ 525 and 527 are a commercial acrylate polymers that are available from Lubrizol Corporation.

In the Examples and the data shown below in TABLE I, various features of receiver elements and formation of printed patterns ("Receiver Element Effects") were evaluated.

Transfer Speed (m/min) refers to linear surface speed through the nip of impression rollers used for lamination.

Impression Effect (mm) refers to the impression distance between rollers past just touching impression.

Solid resistivity (ohm/sq) refers to surface resistivity of solid area deposits of ink 8 mm in diameter, as measured using Surface Resistivity Meter SRM-232 (Guardian Manufacturing Inc.).

Grid resistivity (ohm/sq) refers to surface resistivity of grid patterns of conductive ink and was measured by an ohm meter across a length 104 mm long and 4 mm wide (26 squares).

Line width (µm) was measured by optical microscopy and was the average of seven measurements.

% Ink Transferred (INKtran) refers to the amount of ink that was transferred from the elastomeric relief element to a specific heated receiver element, and was determined by measuring the transmission optical absorbance or density (TOD) (using an ortho filter of an X-Rite 360 Transmission densitometer) of the printable material on the receiver element and the residual printable material composition (INKres) on the elastomeric relief element after contact transfer. The % ink transferred (% INKtran) is calculated as:

$$INKtran = TOD\ INKtran/(TOD\ INKtran + TOD\ INKres)$$

Unless otherwise indicated, all of the Examples were carried out using an apparatus or system that is schematically described as roll-to-roll equipment, as depicted in FIG. 1, which is not intended to be limiting as to the apparatus that can be used to practice the present invention.

As illustrated in FIG. 1, an elastomeric relief element (10) can be provided on a suitable flexographic printing plate roller (20). A plurality of printable material compositions ("inks") can be applied to the uppermost relief surface of elastomeric relief element (10) using the independently arranged Anilox inking systems (30a) and (30b) as suitable application means from ink supplying means (35a) and (35b), respectively, as needed to provide multiple applications and to form a multilayer structure, using respective engagement devices (80a) and (80b) that can be moved back and forth as needed. Each printable material composition can comprise a print material and carrier liquid, and for the embodiments, a certain portion of the carrier liquid can be removed from each printable material composition using independently arranged dryers (40a) and (40b) that is arranged close to elastomeric relief element (10). Elastomeric relief element (10) and flexographic printing plate roller (20) can be disengaged out of contact with a heated receiver element (50) and heated roller (70) until all printable material compositions have been applied to form the multilayer structure.

Heated receiver element (50) can be brought into the apparatus on a suitable path (60) and heated on heated roller (70) at a suitable temperature and time, and then brought into contact with the multilayer structure disposed on the uppermost relief surface of elastomeric relief element (10). The elastomeric relief element (10) can be then separated from the heated receiver element (50) after transferring the multilayer structure constructed from the plurality of printable material compositions to heated receiver element (50). The arrows in FIG. 1 show the direction of the receiver element path (60) as well as the direction of rotation of various components of the apparatus.

Each receiver element was heated by pressing it against a heated silicone rubber-coated print cylinder having a surface hardness of 50 Shore A and a surface temperature of 125° C.

The total outer diameter of this heated silicone rubber-coated print cylinder assembly was 137.8 mm. The plate cylinder assembly was impressed a distance of 0.4 mm into the print cylinder assembly to produce a nip width of 9.5 mm and a 105 µm compression of the elastomeric relief element.

While the plate cylinder assembly and the print cylinder assembly were in compression contact, they were rotated at a linear surface speed of 30 mm/sec. Each multilayer structure on the elastomeric relief element uppermost surface was transferred under these conditions to the heated surface of the respective receiver element, and the elastomeric relief element was compressed by a certain amount, that is at least certain µm of its original thickness when measured at 25° C. The amounts of compression for some of the experiments are described below. After separation of the elastomeric relief element and the receiver element, the printed pattern of multilayer structure on the receiver element was then oven-cured at 105° C. for 5 minutes. This curing is not essential to the invention but it can provide additional benefits of improved conductivity and adhesion of the multilayer structure to the receiver element. For embodiments of this invention, at least 80 weight % of the multilayer structure comprising multiple print materials originally disposed on the uppermost relief surface of the elastomeric relief element was transferred to the heated receiver element.

PChem Ink PFI-722, obtained from PChem Associates (Bensalem, Pa.), was used as a conductive silver-containing printable material composition (ink) in the Examples described below in TABLES I and II. The water-based Black ink was Performa SP4C Process Black XGL044113 (Water Ink Technologies, Inc.) and was used as a carbon black-containing printable material composition (ink). The adhesive used to demonstrate transfer to an uncoated PET film was "Versaflex 9" that was obtained from Owensboro Specialty Polymers (Owensboro, Ky.).

Invention Example 1

PChem PFI-722 ink was applied two times as described above with an eight second wait between applications. The plate was then inked with the water based Performa SP4C Process Black XGL044113 Black ink that had been modified for flexibility by mixing it 1:1 with "Versaflex 9". This ink was also allowed to dry at least 8 seconds before the resulting multilayer structure was transferred onto a Carboset® 525-coated receiver element. After the third application noted above, the plate cylinder with the attached elastomeric relief element containing the multilayer structure was removed and impressed against a provided heated receiver element to provide a printed pattern of the multilayer structure.

Comparative Example 1

PChem ink PFI-722 was applied as described above to an elastomeric relief element two times with an eight second wait between applications. The two applications were also allowed to dry at least 8 seconds and they were then was transferred onto a Carboset® 525-coated receiver element to provide a printed pattern as described above.

A summary of experimental conditions and results is summarized below in TABLE I.

TABLE I

| Example | Receiver Element | Speed and Temperature Effects Transfer Speed (m/min) | Impression (mm) | Solid Resistivity (Ohm/sq) | Grid Resistivity (Ohm/sq) | Comments on lines | Line width (µm) | % Ink Transferred |
|---|---|---|---|---|---|---|---|---|
| Invention Example 1 | Carboset® 525 | 1.5 | 0.4 | 0.23 | 9.5 | Sharp lines | 6.0 | 82 |
| Comparative Example 1 | Carboset® 525 | 1.5 | 0.4 | 0.25 | 15.2 | Sharp lines | 6.0 | 85 |

These results indicate that both Invention and Comparative Examples provided printed patterns on the receiver element having very similar conductivity. However when viewed through backside of the PET film substrate in the receiver element, the pattern grid lines obtained with Invention Example 1 (having a black ink as the innermost printable material composition in the multilayer structure) were less visible and therefore less reflective than the pattern grid lines obtained in Comparative Example 1.

Invention Example 2

PChem PFI-722 ink was applied as described above twice with an eight second wait between applications. Versaflex 9 was then applied to the elastomeric relief element over the PChem PFI-722 ink, and was allowed to dry at least 8 seconds before the resulting multilayer structure was transferred to provide a printed pattern of the multilayer structure on an uncoated PET receiver element as described above.

Comparative Example 2

PChem PFI-722 ink was applied as described above twice with an eight second wait between applications. The two applications of ink were allowed to dry at least 8 seconds and were then transferred together to form a printed pattern onto an uncoated PET film receiver element as described above.

A summary of experimental conditions and results is summarized below in TABLE II.

TABLE II

| Example | Receiver Element | Speed and Temperature Effects Transfer Speed (m/min) | Impression Effect (mm) | Solid Resistivity (ohm/sq) | Grid Resistivity (ohm/sq) | Comments about lines | Line Width (μm) | % Ink Transferred |
|---|---|---|---|---|---|---|---|---|
| Invention Example 2 | Uncoated PET film | 1.2 | 0.4 | 60 | Megaohms | Broken | Poor | 60 |
| Comparative Example 2 | Uncoated PET film | 1.2 | 0.4 | 479 | Megaohms | Broken | Poor | 18 |

The results shown in TABLE II indicate that solid resistivity in the printed pattern was greatly reduced (conductivity increased) and the % ink transferred was substantially increased using the method of the present invention (Invention Example 2) compared to the printed pattern obtained in Comparative Example 2.

Invention Example 3

PChem PFI-722 ink was applied as described above two times with an eight second wait between applications. The elastomeric relief element was then inked with Versaflex 9 that had been mixed 1:1 with Performa SP4C Process Black XGL044113 Black ink. The resulting latex ink mixture is also allowed to dry at least 8 seconds after its application. The resulting multilayer structure was then transferred to form a printed pattern on an uncoated PET film receiver element as described above. This Example demonstrates the ability to transfer a black grid (printed pattern) onto an uncoated PET film. However, the resulting grid lines were less continuous and it was not possible to measure pattern conductivity of the grid. The grid lines, when viewed through the backside of the PET film were less visible.

The invention has been described in detail with particular reference to certain preferred embodiments thereof, but it will be understood that variations and modifications can be effected within the spirit and scope of the invention.

PARTS LIST

10 elastomeric relief element
20 flexographic printing plate roller
30a, 30b Anilox inking systems
35a, 35b ink supply means
40a, 40b dryers
50 heated receiver element
60 receiver element path
70 heated roller
80a, 80b engagement devices

The invention claimed is:

1. A method for forming a pattern of a print material on a receiver element comprising a print material receptive layer, the method comprising:
    providing an elastomeric relief element that comprises a relief pattern comprising (1) an uppermost relief surface, and (2) an average relief image depth of at least 50 relative to the uppermost relief surface,
    applying a first printable material composition to the uppermost relief surface of the elastomeric relief element, the first printable material composition comprising a first print material and a carrier liquid,
    removing at least 50 weight % of the carrier liquid from the first printable material composition that is disposed on the uppermost relief surface of the elastomeric relief element, leaving the first print material on the uppermost relief surface, applying a second printable material composition to the first print material on the uppermost relief surface of uppermost relief surface, the second printable material comprising a second print material and a carrier liquid,
    removing at least 50 weight % of the carrier liquid from the second printable material composition, forming a multilayer structure comprised of the second print material disposed on the first print material, on the uppermost relief surface, and
    transferring the multilayer structure from the uppermost relief surface to a receptive surface of the receiver element,
    wherein the first print material and the second print material are different at least compositionally.

2. The method of claim 1, wherein at least 80 weight % of the carrier liquid is removed from each of the first and second printable material compositions on the uppermost relief surface of the elastomeric relief element.

3. The method of claim 1, wherein the first and second printable material compositions independently have a viscosity of at least 200 cps and up to and including 900 cps.

4. The method of claim 1, wherein the elastomeric relief element is a flexographic printing member and the relief pattern has an average relief image depth of at least 100 μm relative to the uppermost relief surface.

5. The method of claim 1, wherein the elastomeric relief element is provided by imagewise exposing an elastomeric photopolymerizable layer through a mask image.

6. The method of claim 1, wherein the first and second print materials are independently nanoparticles of an electrically conductive material selected from the group consisting of silver, gold, copper, palladium, platinum, nickel, iron, indium-tin oxide, carbon black, and combinations thereof.

7. The method of claim 1, wherein at least one of the first and second printable material compositions comprises a colorant.

8. The method of claim 1, wherein the first and second print materials are independently selected from the group consisting of electrically conductive materials, semi-conductive materials, dielectric materials, small molecule materials, polymeric materials, bio-based materials, electro luminescence materials, and combinations thereof.

9. The method of claim 1, wherein the elastomeric relief element comprises a relief layer comprising the relief pattern, which relief layer is disposed on a substrate.

10. The method of claim 1 wherein the multilayer structure is transferred on the receiver element in a pattern comprising lines having an average line width of less than 15 μm.

11. The method of claim 1 wherein the multilayer structure is transferred in a pattern that comprises a seed material for a subsequent electroless plating process.

12. The method of claim 1, wherein the first print material is selected from the group consisting of nanoparticles of silver, gold, palladium, nickel, and platinum, and the second print material is less reflective than the first print material.

13. The method of claim 12, wherein the second print material comprises carbon black.

14. The method of claim 1, wherein the first print material is less reflective than the second print material.

15. The method of claim 14, wherein the first print material is carbon black and the second print material is selected from the group consisting of nanoparticles of silver, gold, palladium, nickel, copper, and platinum.

16. The method of claim 1, further comprising heating the receiver element before transferring the multilayer structure from the uppermost relief surface to the receptive surface of the receiver element, the heating being to a heating temperature that is higher than the glass transition temperature ($T_g$) of the receptive layer.

17. The method of claim 16, wherein the multilayer structure is transferred from the uppermost relief surface to the receptive surface in a manner such that the elastomeric relief element is compressed by at least 10 μm of its original thickness.

18. The method of claim 1, further comprising separating the elastomeric relief element from the receiver element to leave a pattern of the multilayer structure on the receiver element, wherein at least 70 weight % of the multilayer structure originally disposed on the uppermost relief surface of the elastomeric relief element is transferred to the receiver element.

19. The method of claim 1, wherein the relief pattern in the elastomeric relief element has an average relief image depth of at least 100 μm relative to the uppermost relief surface, and a shoulder angle of at least 50° and up to but not equal to 75° from vertical.

20. The method of claim 1, wherein a pattern of the multilayer structure on the receiver element has an average optical density of at least 3.5.

\* \* \* \* \*